US008173908B2

(12) United States Patent
Altebaeumer et al.

(10) Patent No.: US 8,173,908 B2
(45) Date of Patent: May 8, 2012

(54) DEVICE INTERCONNECTS

(75) Inventors: Thomas Heinz-Helmut Altebaeumer, Oxford (GB); Stephen Day, Chipping Norton (GB); Christian Lang, Oxford (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 427 days.

(21) Appl. No.: 12/413,660

(22) Filed: Mar. 30, 2009

(65) Prior Publication Data
US 2009/0242260 A1 Oct. 1, 2009

(30) Foreign Application Priority Data
Apr. 1, 2008 (GB) .................................. 0805848.9

(51) Int. Cl.
H05K 1/11 (2006.01)
H05K 1/18 (2006.01)

(52) U.S. Cl. ........................................ 174/261; 361/761

(58) Field of Classification Search .................. 174/261, 174/260; 361/762, 761, 763, 770, 772
See application file for complete search history.

(56) References Cited

U.S. PATENT DOCUMENTS

| 6,262,483 | B1 | 7/2001 | Shen |
| 6,872,645 | B2 | 3/2005 | Duan et al. |
| 6,920,260 | B2 | 7/2005 | Zhang et al. |
| 7,067,328 | B2 | 6/2006 | Dubrow et al. |
| 7,068,898 | B2 | 6/2006 | Buretea et al. |
| 7,073,157 | B2 | 7/2006 | DeHon et al. |
| 7,091,120 | B2 | 8/2006 | Buretea et al. |
| 7,193,239 | B2 | 3/2007 | Leedy |
| 2003/0089899 | A1 | 5/2003 | Lieber et al. |
| 2003/0201521 | A1 | 10/2003 | Tsai et al. |
| 2004/0079278 | A1 | 4/2004 | Kamins et al. |
| 2005/0180194 | A1 | 8/2005 | Kang |
| 2005/0255303 | A1* | 11/2005 | Sawatari et al. ............. 428/209 |
| 2007/0102747 | A1 | 5/2007 | Chen et al. |

(Continued)

FOREIGN PATENT DOCUMENTS
GB 2442768 4/2008
(Continued)

OTHER PUBLICATIONS

A.W. Topol et al., "Three-dimensional integrated circuits", IBM Journal of Research & Development, vol. 50, No. 4/5, p. 491-506 (2006).

(Continued)

Primary Examiner — Timothy Thompson
Assistant Examiner — Roshn Varghese
(74) Attorney, Agent, or Firm — Renner, Otto, Boisselle & Sklar, LLP

(57) ABSTRACT

A method of fabricating a device structure, comprises: forming an insulating layer (3b) over a first set of devices disposed over a substrate (3); forming one or more vias in the insulating layer; disposing a second set of devices (6) over the insulating layer, wherein devices of the second set comprise respective electrical contacts (6a) and are disposed over the insulating layer (3b) such that a side on which a contact (6a) can be accessed faces the substrate (3); and forming one or more electrical contacts between the first set of devices and the second set of devices (6) through the via(s). The second set of devices and at least one via are positioned such that one or more of the vias lies at least partially within the footprint of two devices, each belonging to a different device layer.

9 Claims, 6 Drawing Sheets

U.S. PATENT DOCUMENTS

2007/0161213 A1* 7/2007 Hiura et al. .................. 438/478
2009/0102037 A1* 4/2009 Kim .............................. 257/686
2009/0242260 A1 10/2009 Altebaeumer et al.

FOREIGN PATENT DOCUMENTS

WO 2009/123332 A1 10/2009

OTHER PUBLICATIONS

J.H. Ahn et al., "Heterogeneous Three-Dimensional Electronics by Use of Printed Semiconductor Nanomaterials", Science vol. 314, p. 1754-1757 (2006).

A. Javey et al., "Layer-by-Layer Assembly of Nanowires for Three-Dimensional, Multifunctional Electronics" Nano Letters vol. 7, No. 3, p. 773-777 (2007).

L Demoracski et al., "Connecting and Configuring Defective Nano-Scale Networks for DNA self-Assembly", Nano-Networks and Workshops, 2006, NanoNet'06. 1st International Conference on, pp. 1-5 (ISBN: 1-4244-0391-X).

Search Report for corresponding application No. GB 0805848.9 dated Jun. 30, 2008.

Copending U.S. Appl. No. 12/413,613, filed Mar. 30, 2009.

Office Action for co-pending U.S. Appl. No. 12/413,613 dated Nov. 30, 2010.

Co-pending U.S. Appl. No. 13/084,877, filed Apr. 12, 2011.

Yu Huang et al. "Nanowires for Integrated Multicolor Nanophotonics", small, vol. 1, No. 1, p. 142-147 (2005).

Yu Huang et al. "Logic Gates and Computation from Assembled Nanowire Building Blocks", Science, vol. 294, p. 1313-1317 (2001).

Michael C. McAlpine et al. "High-Performance Nanowire Electronics and Photonics and Nanoscale Patterning on Flexible Plastic Substrates", Proceedings of the IEEE, vol. 93, No. 7, p. 1357-1363 (2005).

British Search Report for related British Application No. GB0805850.5 dated Jun. 29, 2008.

* cited by examiner (a)

(b)

(c)

DEVICE INTERCONNECTS

This nonprovisional application claims priority under U.S.C. §119(a) on Patent Application No. 0805848.9 filed in United Kingdom on 1 Apr., 2008, the entire contents of which are hereby incorporated by reference.

FIELD OF THE INVENTION

This invention relates to the integration of multiple device layers onto receiver substrates. Monolithic integration of several device layers on a substrate is in most cases technically not viable because the required material can't be deposited with sufficient quality onto the substrate (e.g. due to structural incompatibilities) and/or the process flow to form a later layer may be incompatible with devices previously fabricated on the substrate (e.g. high temperature steps are undesirable after metallization of previous devices, or contamination issues).

BACKGROUND OF THE INVENTION

Display technologies are an example where the structural incompatibilities in conjunction with the low thermal budget of most transparent substrates (typically glass or plastic substrates) inhibit the formation on the substrate of single-crystalline semiconductors which are required to integrate high performance semiconducting devices with differing functionality. Examples of such devices include npn transistors and pnp transistors (e.g. to form Complementary Metal Oxide Semiconductor (CMOS) circuits), pressure sensors (e.g. for haptic interfaces), light sensors (e.g. for adapting the display to the ambient lighting conditions) and last but not least red, green and blue Light Emitting Devices (LEDs) (e.g. for emissive displays) on transparent substrates which may also be flexible.

These devices may contain elongate low dimensional structures, which are formed onto a suitable substrate (a "formation substrate") but can be subsequently transferred onto a different substrate (known as a "target substrate" or "receiver substrate"). Examples of devices which may contain elongate low dimensional structures include but are not restricted to npn transistors, pnp transistors, sensors, capacitors, red, green and blue LEDs. The bulk of the receiver substrate may consist of glass, polymers, metals, or semiconductors or any combination of these materials. Forming the devices on a formation substrate and transferring them to a receiver substrate overcomes any incompatibility between the formation process and the receiver and/or earlier formed devices.

Where physically different structures consisting of or containing low dimensional structures are formed on a formation substrate and are transferred to a target substrate, it is often desirable to be able to exercise a degree of control over the arrangement of these devices on the target substrate, both with respect to predefined features on the target substrate and with respect to each other.

Additionally, stacking device layers enables higher device densities and increased interconnectivity. This is of particular advantage for displays used in mobile devices (e.g. mobile phones, PA's), requiring a stringent form-factor.

The term "low dimensional structure" as used herein refers to a structure that has at least one dimension that is much less than at least a second dimension.

The term "elongate structure" as used herein refers to a structure having two dimensions that are much less than a third dimension. The definition of an "elongate structure" lies within the definition of a "low dimensional structure", and a nanowire is an example of a structure that is both a low dimensional structure and an elongate structure.

Low dimensional structures that are not elongate structures are known. For example, a 'platelet', which has two dimensions of comparable magnitude to one another and a third (thickness) dimension that is much less than the first two dimensions constitutes a "low dimensional structure" but is not an "elongate structure".

For the avoidance of any doubt, the term "physically different" means in the context of this invention that those sections of the elongate low dimensional structure which determine the device performance differ in at least one of the following points:
1. material composition
2. material composition profile
3. cross-sectional geometry (e.g. different side facets at different sections along the low dimensional elongate structures)
4. cross sectional area
5. crystallographic orientation
6. length Methods are known for transferring devices from a first substrate to a second substrate. However, at present no suitable techniques are available for applying a high density of devices to a receiver substrate such that all of the following desiderata are met:
1. More than two device layers can be integrated onto a receiver substrate.
2. The achievable number of inter-layer interconnects can be greater than the lowest number of devices contained in a device layer.
3. The inter-layer device interconnects do not increase the footprint of the corresponding circuits considerably.
4. The way the inter-layer device interconnects are formed and the way the devices are arranged within each layer does not impose constraints onto the type of circuit architecture to be realized (e.g. no limitation to cross-bar architectures) allowing to combine different architectures.
5. The vias of the inter-layer device interconnects can be defined using conventional lithography.
6. No thinning of the transferred structures before or after the transfer is required.
7. No Silicon-on-Insulator (SOI) material is required.

A. W. Topol et al. give, in IBM Journal of Research & Development, Volume 50, Number 4/5, p 491 (2006), an overview of achieving three-dimensional integrated circuits by wafer bonding techniques. Face-to-face bonding is limited to a maximum of two device layers, while face-to-back bonding suffers from a low interlayer via density. This problem can be mitigated by using a SOI-based face-to-back bonding process, but this is more costly.

Science Vol. 314, p. 1754 (2006) demonstrated the assembly of device layers of physically different devices on a polymer substrate. Each device layer is separated by a polymer layer. Vias are formed by a combination of photolithography and etch techniques.

Nano Letters Vol. 7, No. 3, p. 773 (2007) demonstrates the assembly of different layers of nanowire devices using a dry transfer method. No interlayer device interconnects are formed and no information is provided how inter-layer device interconnects could be formed. Furthermore, the nanowires show poor edge alignment, imposing a challenge on forming interconnects between particular sections of nanowires belonging to different device layers.

U.S. Pat. No. 6,920,260 and U.S. Pat. No. 7,073,157 describe array-based architectures for molecular electronics.

The array consists of conducting electrodes which cross each other. In between these electrodes a molecular junction is formed. The electrodes could be implemented by using two layers of aligned nanowires with the nanowires of the first layer being aligned perpendicular to the nanowires of the second layer.

Nano-Networks and Workshops, 2006, NanoNet '06. 1st International Conference on, pp. 1-5 (ISBN: 1-4244-0391-X) describes a 3D nanowire-based programmable logic architecture based on a cross-bar arrangement. This publication, as well as U.S. Ser. No. 06/920,260 and U.S. Pat. No. 7,073,157B2, describe architectures which are confined to a cross-bar arrangement.

U.S. Pat. No. 7,193,239 describes three-dimensional semiconductor circuits formed by stacking substrates having monolithically integrated circuits. The topside of a circuit layer is bonded to a substrate, and the exposed backside of the substrate is thinned to 50 mm or less. Feed-throughs are then formed in registration with contacts of the circuit layer. The steps of bonding, thinning, and forming feed-throughs are then repeated for subsequent circuit layers.

Co-pending UK patent application GB2442768 describes a method of making encapsulated low dimensional structures such that they are suitable to be transferred to a different substrate. During the transfer the number of elongate structures, their alignment, spacing, and their orientation are maintained. Furthermore, these structures can be subsequently processed into devices using conventional lithographic methods in combination with subtractive (e.g. dry etching) and additive techniques (e.g. metal deposition).

The current invention addresses the challenge of providing an improved method of fabricating three dimensional device architectures on a receiver substrate. Preferably, the method would allow most or all of the following desiderata to be met:

1. More than two device layers can be integrated onto a receiver substrate.
2. The achievable number of inter-layer interconnects can be greater than the lowest number of devices contained in a device layer.
3. The inter-layer device interconnects do not increase the footprint of the corresponding circuits considerably.
4. The way the inter-layer device interconnects are formed and the way the devices are arranged within each layer does not impose constraints onto the type of circuit architecture to be realized (e.g. no limitation to cross-bar architectures) allowing to combine different architectures.
5. The vias of the inter-layer device interconnects can be defined using conventional lithography.
6. No thinning of the transferred structures before or after the transfer is required.
7. No Silicon-on-Insulator material is required.
8. Different device layers may contain physically different devices.

SUMMARY OF THE INVENTION

A first aspect of the present invention provides a method of fabricating a device structure, the method comprising:

forming an insulating layer over a first set of devices disposed or formed over a substrate;

forming one or more vias in the insulating layer;

disposing a second set of devices over the insulating layer, wherein devices of the second set comprise respective electrical contacts and are disposed over the insulating layer such that a side on which a contact can be accessed faces the substrate; and forming one or more electrical contacts between the first set of devices and the second set of devices through the via(s);

wherein the vias and/or the second set of devices is/are positioned such that at least one of the vias containing electrical interconnects lies at least partially within the footprint of both devices which it connects; and wherein at least one device of the second set comprises electrical contacts that can be accessed on two opposing sides and is disposed over the insulating layer such that one of the sides on which contacts can be accessed faces the substrate.

Positioning the second set of devices such that a via containing an electrical interconnect lies at least partially within the footprint of the devices which are connected by the electrical interconnect reduces the area of the substrate not occupied by devices, thereby allowing more devices to be provided per unit area of substrate. Most importantly, it allows to achieve the most direct (meaning shortest) interlayer interconnects resulting in a reduction of the resistance and capacitance of these interconnects.

To achieve this, the interconnects have to extend substantially perpendicular off the substrate surface as indicated in FIGS. 2(a)-2(c), 3(a)-3(b), 4(a)-4(b) and 5 without the need to route them "around" devices. This is possible because the devices to be connected can be connected from two opposing sides with one side facing the substrate.

It should be noted that, as described below, the devices may contain nanowires or other elongate structures. For example, the elements 6a in FIG. 2(b) may be nanowires protruding out of the matrix 2a shown in FIG. 1(b), and these nanowires will not necessarily form a continuous footprint as can be seen in FIG. 1(c). The term "footprint" of a device as used herein is intended to encompass the space in between the nanowires or other elongate structures within each device in addition to the footprint of the nanowires or other elongate structures themselves, so that the vias 9 shown schematically in FIGS. 6(a), 6(c) and 6(f) are considered as lying partially within the footprint of the respective device 6, as well as the vias shown in FIGS. 6(b), 6(d) and 6(e). (The boundary 11 of the footprint of the device 6 of FIGS. 6(a)-6(f) is shown in FIG. 6(g), and the footprint includes the region within the boundary 11). Specifying that a via is wholly or partially within the footprint of a device does not require that the via is wholly or partially within the footprint of a nanowire or other elongate structure that is part of the device.

(It should be noted that the arrangement of device in one layer is not necessarily well correlated with the arrangement of devices in the other layer(s). Thus, the fact that it may be possible to position a via between one device in a layer and an associated device in another layer as shown in one of FIGS. 6(a) to 6(d) does not mean that this will be necessarily be possible for all devices in the layer).

It is further preferable that the centre of a via is approximately coincident with the lateral centre of the devices. FIGS. 6(a) to 6(f) are schematic plan views showing the position of a via 9 superimposed on the plan of a device 6. FIGS. 6(a) to 6(d) are examples of preferred arrangements, in which the centre of the via is approximately coincident with the axial centreline 10 of the devices. FIGS. 6(e) and 6(f) are examples of less preferred arrangements, in which the centre of the via is not coincident with the centreline of the devices.

If the device of one layer are arranged directly above those of another layer it is possible, and preferable, for a via containing an electrical contact interconnecting a device in one layer and a device in another layer to be positioned such that its centre is approximately coincident with the axial centreline of both devices. If however there is any lateral offset between the device in one layer and the device in the other layer it is of course not possible for a via containing an electrical contact interconnecting those devices to be positioned such that its centre is approximately coincident with the centreline of both devices; in this case, the via is preferably positioned such that its centre is as close as possible to the centrelines of the devices. If the via is offset such that it doesn't overlap with the devices, it is necessary to run an electrical contact to the via and this means that this area is no longer available for other devices. This is why it is advantageous to position vias on or near the centreline of each device, which means that the electrical contact within the device layer is shortest (assuming that the footprint of the via is comparable to the size of the device).

It is important to keep in mind that the footprint of a via does not necessarily determine the electrical contact area. This is normally determined by another metallization layer which coincides with the device layers, allowing the electrical contact area to be maximized (which is important to reduce resistances and therefore dissipation of heat/loss of energy). In embodiments of the invention, it may be required to form a electrical contact on one or both of the two devices that has an area larger than the area of the via and, in such a case, the via connects these two contact areas. A similar situation will arise if the ends of the nanowires are to be connected. The contact areas will be square/rectangular, so that each nanowire has the same contact area.

It should however be noted that some nanowires at the "edge" of the device may be not connected. In this case such nanowires will add stray capacitances and the device performance will vary from device to device depending on how reproducibly some wires are missed.

Providing at least one device of the second set with electrical contacts that can be accessed on two opposing sides allows any desired number of layers of devices to be stacked.

At least one device of the second set may comprise a first electrical contact that can be accessed from a first side of the device and a second electrical contact that can be accessed from a second side of the device, the second side being opposed to the first side. If the structure is, for example, oriented such that the second set of devices is vertically above the first set, the first electrical contact of a device of the second set may be accessible from the top side and the second electrical contact may be accessible from the bottom side.

At least one via in the insulating layer may lie at least partially within the footprint of one of the devices of the first layer and lies at least partially within the footprint of one of the devices of the second layer, whereby the device of the second layer lies at least partially within the footprint of the device of the first layer, allowing the interconnect to connect both devices while substantially extending along the shortest possible path for a given thickness of the insulating layer through which the via is formed.

The method may comprise depositing a second insulating layer over the second set of devices.

The method may comprise forming one or more second vias in the second insulating layer.

The method may further comprise:
disposing a third set of devices over the second insulating layer, such that a side of the third devices on which electrical contacts can be accessed faces the substrate; and
forming one or more electrical contacts between the second set of devices and the third set of devices through the second via(s).

At least one device of the third set may comprise electrical contacts that can be accessed on two opposing sides.

The devices of the first set may comprise electrical contacts that can be accessed on two opposing sides.

The devices of the second set may be mirror symmetric, about a symmetry plane extending substantially parallel to the substrate. The devices of the third set may be mirror symmetric, about a symmetry plane extending substantially parallel to the substrate. Devices of the first set may also be mirror symmetric, about a symmetry plane extending parallel to the substrate (and, if any further layer of devices is present devices of this layer may also be mirror symmetric about a symmetry plane extending parallel to the substrate).

The second insulating layer may comprise a polymer, silicon nitride, or silicon dioxide. Additionally, it may be or contain an adhesive layer.

The method may comprise fabricating the devices of the first set on the substrate.

The method may comprise fabricating the devices of the first set on a formation substrate and subsequently transferring the devices of the first set to the substrate.

The devices of a set may be arranged in a respective layer.

Disposing the second set of devices over the insulating layer may comprise bonding only selected ones of the second set of devices to the insulating layer. The devices of the second set will typically be adhered to a host substrate, and only selected ones may be bonded to the insulation by use of a patterned adhesive layer.

Alternatively, disposing the second set of devices over the insulating layer may comprise bonding only selected ones of the second set of devices to the electrical contact contained by the vias formed within the insulating layer.

Disposing the third set of devices over the second insulating layer may comprise bonding only selected ones of the third set of devices to the second insulating layer.

Alternatively, disposing the third set of devices over the insulating layer may comprise bonding only selected ones of the third set of devices to the electrical contact contained by the vias formed within the insulating layer.

An electrical contact may connect the bottom side of at least one device of the second device layer with the top side of at least one device of the first device layer.

An electrical contact may connect the top side of at least one device of the second device layer with the top side of at least one device of the first device layer.

The devices of the first layer may comprise elongate low-dimensional structures. They may comprise elongate low-dimensional structures extending substantially parallel to the substrate.

The devices of the second layer may comprise elongate low-dimensional structures. They may comprise elongate low-dimensional structures extending substantially parallel to the substrate.

A second aspect of the present invention provides a circuit comprising:
a) a first layer of devices;
b) an insulating layer covering the first layer of devices, the insulating layer containing one or more vias, the or each via exposing a respective contact of a device of the first layer;
c) a second layer of devices each having a respective contact, the devices of the second layer being positioned such that a contact of the device is aligned above a respective via in the insulating layer; and
d) electrical contacts formed through at least one via connecting a device of the first layer of devices with a device of the second layer of devices, wherein at least one via containing an electrical contact lies at least partially within the footprint of both devices which are connected by the interconnect running through the corresponding via, wherein at least one device of the second layer comprises electrical contacts that can be accessed on two opposing sides and is disposed over the insulating layer such that a contact of the device is facing and is aligned above a respective via in the insulating layer.

At least one device of the second layer may comprise a first electrical contact that can be accessed from one side of the device and a second electrical contact that can be accessed from an opposing side of the device.

An electrical contact may connect the bottom side of at least one device of the second device layer with the top side of at least one device of the first device layer.

An electrical contact may connect the top side of at least one device of the second device layer with the top side of at least one device of the first device layer.

The devices of the first layer may comprise elongate low-dimensional structures. They may comprise elongate low-dimensional structures extending substantially parallel to the substrate.

The devices of the second layer may comprise elongate low-dimensional structures. They may comprise elongate low-dimensional structures extending substantially parallel to the substrate.

The devices of the second layer may be mirror symmetric about a symmetry plane extending parallel to the substrate. Devices of the first layer may also be mirror symmetric about a symmetry plane extending parallel to the substrate (and, if a third or subsequent layer of devices is present these may also be mirror symmetric about a symmetry plane extending parallel to the substrate).

The substrate may be transparent.

The substrate may be a glass substrate or a polymer substrate.

The substrate may be a semiconductor substrate or a conductive substrate.

The first insulating layer may comprise a polymer, silicon nitride, or silicon dioxide. Additionally, it may be or contain an adhesive.

A centre of at least one via in the insulating layer may be approximately coincident with a centreline of an associated device of the first layer and/or with a centreline of an associated device of the second layer.

A centreline of a device of the first layer may be substantially coincident with a centreline of an associated device of the second layer, and a centre of an associated via in the insulating layer may be substantially coincident with a centreline of the device of the first layer and with a centreline of the associated device of the second layer. In this embodiment, there is little or no lateral offset between devices of the first layer and devices of the second layer such that a centre of a via in the insulating layer may be coincident, or nearly coincident, with the centreline of devices of the first layer and with the centreline of devices of the second layer. (A device in the first layer and a device in the second layer are said to be "associated" with one another if they are connected by an electrical interconnect. The "associated" via is the via that contains the electrical interconnect that connects the two devices).

It should be noted that, where each layer comprises an arrangement of devices, the arrangement of devices in one layer is not necessarily well correlated with the arrangement of devices in the other layer(s). Thus, the fact that the layers of devices are arranged such that the centreline(s) of one or more devices in one layer are substantially coincident with the centreline(s) of respective device(s) in an adjacent layer, does not mean that this is necessarily true for all devices in the layer (although it is possible to envisage arrangements of devices where this would be the case for all devices in a layer).

Similarly, the fact that the footprint(s) of one or more devices in one layer substantially overlap the footprint(s) of respective device(s) in an adjacent layer does not mean that this is necessarily true for all devices in the layer.

A third aspect of the present invention provides a device manufactured by a method of the first aspect.

This invention utilizes device structures on which contacts can be formed on two opposing sides with one side facing the substrate on which they are to be assembled. Devices with mirror symmetry fulfill this condition and enable the construction of three-dimensional circuit architectures where the interlayer interconnects are defined by lithographic means without the need of dedicating significant amounts of the substrate area to layer-interconnects.

In the fabrication of a circuit of the invention, a first layer of devices is either fabricated on or transferred to a receiver substrate. The transfer process may involve adhesives or metals which may be applied to the receiver substrate or the device structures or both.

The devices within the first layer may have mirror symmetry.

The receiver substrate may be transparent. In this case, alignment of the structures with respect to well-defined positions on the receiver substrate may be done through the receiver substrate.

The receiver substrate may consist of a glass or a polymer or both.

The receiver substrate may consist of a conductor or a semiconductor.

The first layer of device structures may consist of semiconductor devices fabricated on a semiconductor substrate.

Subsequently, an insulating layer with vias is formed on top of the devices with the vias exposing contacts of the devices of the first layer. Subsequently, the vias may be filled with a suitable conductor to form electrical contacts through the insulating layer.

The insulating material may be a polymer or silicon dioxide or silicon nitride.

A suitable conductor includes metals, conducting polymers, highly doped semiconductors or silicides and any combination of the above.

Subsequently, a second set of devices on which contacts can be accessed on two opposing sides, with one side facing the receiver substrate, are transferred to the receiver substrate. This transfer process may involve adhesives or metals which may be applied to the receiver substrate or the structures or both. If device structures with mirror symmetry are transferred to the receiver substrate, the symmetry plane preferably lies parallel to the surface of the receiver substrate.

The adhesion enabling the transfer may be provided by a cross-linkable polymer.

The adhesion enabling the transfer may be provided by a suitable metal such as copper or gold.

Suitable device structures with mirror symmetry include but are not restricted to nanowires and nanotubes as well as composites containing nanowires and nanotubes as described in GB2442768.

The steps of depositing an insulating layer and transferring a further set of devices may be repeated a desired number of times, to form any desired circuit.

Additionally or alternatively, the step of depositing an insulating layer may be repeated such that a final layer of devices can be bonded on top of the previously transferred layer of structures with mirror symmetry.

The device structures within the last layer may have mirror symmetry.

The device structures within the last layer may be semiconductor devices fabricated on a semiconductor substrate.

The material attached to the device structures of the last layer before being transferred may be partially or totally removed.

Key advantages of the current invention over the prior art are as follows.

1. The disadvantages particular to face-to-face bonding and face-to-back bonding are removed as the distinction between the two vanishes if devices on which contacts can be formed on either side (the one facing away from the substrate and the one facing the substrate) are used. (Most conventional planar devices do not exhibit this property). This means in particular that more than two device layers can be assembled in the invention while the most direct and therefore simple inter-layer device interconnects can be realized (no "routing" of interlayer-interconnects around devices is required). This means that a high inter-layer interconnect density can be achieved without compromising on device density. Furthermore, the capacitance and resistance of the interlayer interconnects is reduced which results in advantages regarding power dissipation and circuit speed.

2. One unsolved challenge particular to nanowire-based three-dimensional circuits assembled on a receiver substrate on which no epitaxial nanowire growth is possible remains the formation of interlayer-interconnects at well defined positions along the nanowires and positioning these nanowires at well defined positions on the substrate. In the current invention, this is possible without allocating a significant area of the chip to form the interlayer-interconnects because a significant part of the interconnect area coincides with the device area. For the implementation of this invention, the structure described in GB2442768 is particularly suited as it is mirror-symmetric. It also contains a well defined number of highly aligned nanowires. As a result, this structure is particularly suited to realize devices where one device consists of more than one nanowire. Consequently, the desired size of the electrical device contacts can be engineered by altering the number of nanowires such that it is comparable to the resolution of the lithography used to define these contacts. This can be advantageous for transistor applications requiring high speeds as it allows the drive current available for a given contact area to be maximized. In other words, the proportions of the device (as determined by nanowire diameter and the number of nanowires) with respect to the metal interconnects and metal leads are in a healthy proportion allowing to charge them up at a considerably higher speed as a device containing only a single nanowire could. This invention teaches a method in how to realize three-dimensional circuitry with devices predominantly consisting of elongate low-dimensional structures such as nanowires or nanotubes. Moreover, in a preferred embodiment, the use of the method disclosed in GB2442768 allows to harvest the benefits which nanowires offer if the application does not require the ability to address individual nanowires but intends to use the collective response of nanowires operated in parallel. This way, generally envisaged advantages such as improved gating due to wrap-around gates or new phenomena exploiting the low-dimensional geometry can be still harvested. This invention discloses a efficient way in how the increased device size in one dimension caused by the arrangement of several nanowires in parallel and the resulting lower device density can be offset by extending the circuitry in another extension (perpendicular to the substrate). Last but not least, one constraint common to one of the most researched three dimensional configurations using elongate low-dimensional structures, commonly termed cross-bar architectures, is to be limited to a particular circuit architecture based on crossing elongate low-dimensional structures. This induces a more restrictive set of circuit operations available to the circuit designer attempting to realize three-dimensional circuits based on low-dimensional elongate structures. This restriction is removed by the method described in this disclosure in conjunction with GB2442768.

Additional objects, features, and strengths of the present invention will be made clear by the description below. Further, the advantages of the present invention will be evident from the following explanation in reference to the drawings.

BRIEF DESCRIPTION OF THE DRAWINGS

Preferred embodiments of the present invention will now be described by way of illustrative example with reference to the accompanying figures in which.

DESCRIPTION OF THE EMBODIMENTS

Figure 1:
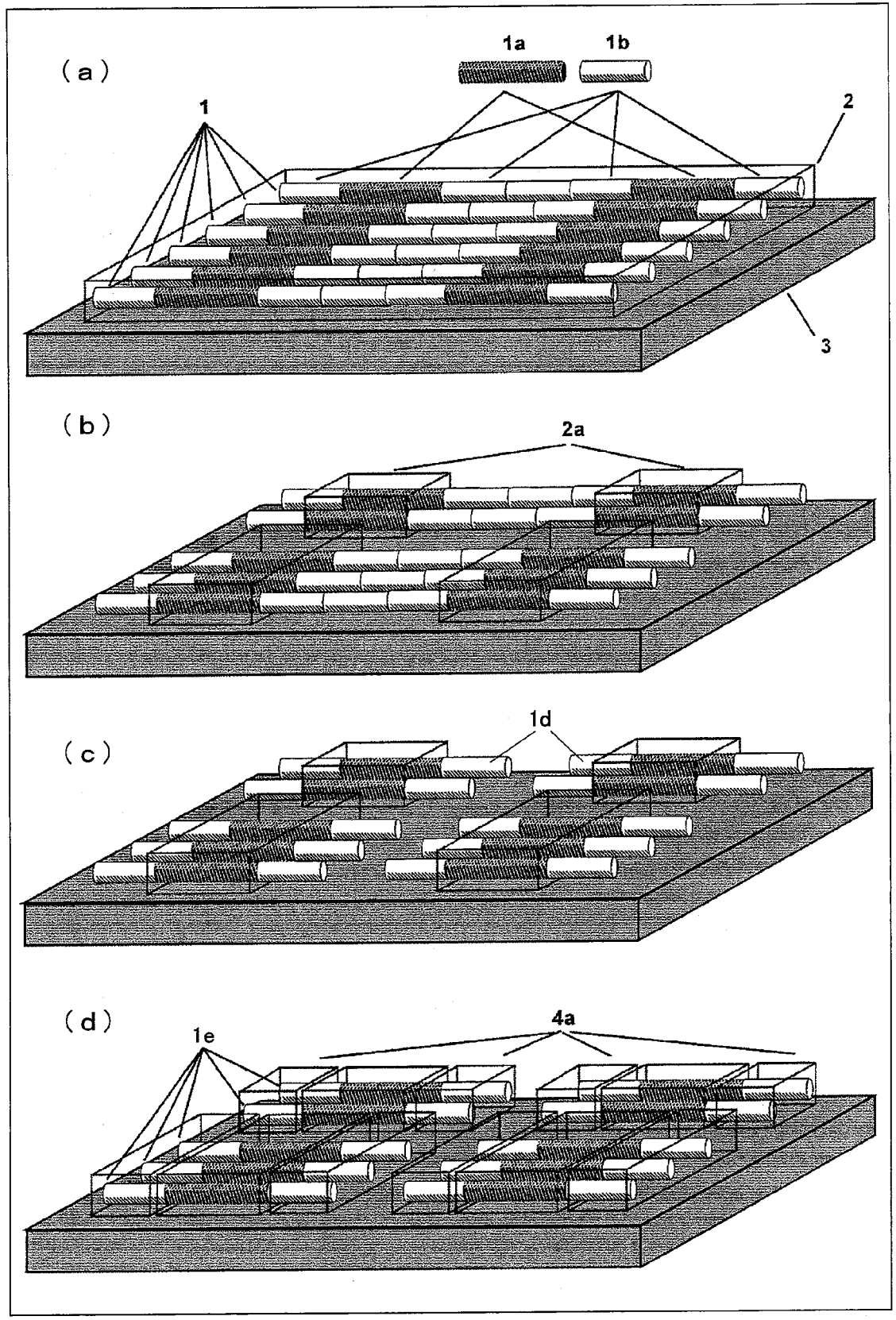
FIGS. 1(a) to 1(d) illustrate how elongate low-dimensional structures which are encapsulated in a matrix can be processed into different devices.

FIGS. 1(a) to 1(d) show the initial steps of a fabrication method in which a plurality of devices is fabricated on a substrate. In this particular example, the starting material consists of a plurality of parallel and edge aligned elongate low-dimensional structures 1 which are encapsulated in a matrix 2 and positioned on a substrate 3 so as to extend substantially parallel to the substrate, as shown in FIG. 1(a). In the example of FIG. 1(a) the elongate low-dimensional structures 1 do not have a uniform constitution along their length but contain regions 1a, 1b of different constitution from one another. For example, one or more of the following may differ between the regions 1a and the regions 1b: material composition, material composition profile, cross-section geometry, cross-sectional dimensions and orientation.

The substrate 3 may be formed of any suitable material and may, for example, be a transparent substrate, for example a glass substrate or a transparent plastics substrate. Alternatively the substrate 3 may be polymer substrate, a semiconductor substrate or a conductive substrate. Subsequently, the matrix is partially removed leaving portions 2a of the matrix material which still encapsulate a particular region of the elongate low-dimensional structures. Furthermore, one or more elongate low-dimensional structures may be partially or completely removed during this process step. FIG. 1(b) shows the devices after completion of this process step. Finally, the elongate low-dimensional structures may be separated into shorter entities 1d as shown in FIG. 1(c) and additional contacts 4a are fabricated [FIG. 1(d)]. Alternatively, the separation of the nanowires illustrated in FIG. 1(c) may be done after forming the contacts 4a in FIG. 1(d). The "tape-like" structure shown in FIG. 1(a) may for example be fabricated using a method disclosed in GB2442768.

It should be noted that the invention does not require that "tape-like" structure shown in FIG. 1(a) is fabricated with the nanowires initially extending parallel to the substrate. The "tape-like" structure shown in FIG. 1(a) may for example be fabricated on a formation substrate and transferred to the substrate 3. Alternatively, the nanowires may be fabricated on the substrate 3 but such that they are not initially oriented parallel to the substrate, and then re-oriented so as to extend generally parallel to the substrate 3—for example the nanowires may be fabricated with a flexible joint as disclosed in co-pending UK patent application No. 0805846.3, the contents of which are hereby incorporated by reference, so as to facilitate re-orientation of the nano-wires so as to extend generally parallel to the substrate.

The method of UK patent application No. 0805846.3 comprises forming a flexible element in a low-dimensional structure, for example a nanowire, such that the flexible element has different elastic properties to a body portion of the low-dimensional structure.

In principle, the flexible element of UK patent application No. 0805846.3 may be formed as the low dimensional structures are grown. For example, the flexible element may be realized by providing one or more of the nanowires with a portion having a reduced cross-section dimension. When nanowires are grown using a metal catalyst, the surface tension of the catalytic metal used during growth of nanowires affects the contact area between the catalyst and the already grown parts of the nanowires. This contact area determines the nanowire diameter. Varying the surface tension, for example by varying the temperature and/or gas-composition, will thus affect the diameter of the nanowires and allow the nanowires to be grown with a section having a reduced diameter, compared to the diameter of the nanowires at other points along their lengths. In general, however, it is expected that it will be more convenient to form the flexible element after the elongate structures have been grown.

Providing the flexible element of UK patent application No. 0805846.3 may comprise providing, in a low-dimensional structure, a first portion that has different elastic properties to a second portion, the first portion being at a different axial position along the low-dimensional structure to the second portion. Providing the flexible element may comprise reducing the stiffness of this portion, or forming the portion with a lower stiffness, in comparison to the other sections—by either realizing a reduced second moment of area of the first portion or by choosing a lower elastic modulus or both.

Forming the flexible element of UK patent application No. 0805846.3 may comprise making a cross-sectional dimension of a first portion of a low-dimensional structure less than the corresponding cross-sectional dimension of a second portion of the low-dimensional structure, whereby the first portion of the low-dimensional structure comprises the flexible element. For example, in the case of a cylindrical low-dimensional structure, forming the flexible element may comprise making the diameter of the first portion less than the diameter of a second portion. Reducing the diameter of a portion of the low dimensional structure is a straightforward way of obtaining the flexible element, and the properties of the flexible element can be selected by choice of appropriate values for the length and diameter of the reduced-diameter portion of the low dimensional structure. This method is not however limited to reducing the diameter of the first portion, i.e. to making the first portion smaller in two dimensions, and it may also comprise thinning only one dimension of the first portion. This may be achieved by using a directional etch (e.g., physical sputtering, exploiting etches or oxidation steps whose rates depend on the crystal orientation). When applied to a cylindrical low-dimensional structure, this would result in a first portion with a cross-section that is generally oval.

Alternatively, in the method of UK patent application No. 0805846.3 the low-dimensional structures may be adhered to the substrate using a low-elastic modulus adhesive such that the adhesive acts as the flexible element.

In formal terms, what is required to form a flexible element in the method of UK patent application No. 0805846.3 is forming or providing a first portion of a low-dimensional structure with a cross-section that has a lower second moment of area than the cross-section of the second portion.

Where the method of UK patent application No. 0805846.3 is applied to a group of low-dimensional structures, it may not be necessary to reduce the cross-sectional dimension of a portion of each low-dimensional structure in order to form the flexible element. Provided that a sufficient number of the structures are provided with a portion that is sufficiently flexible and strong so that the group of structures as a whole remains connected to the substrate during the re-orientation process it does not matter if others of the low-dimensional structures should fracture when the structures are re-oriented or if others of the low-dimensional structures have inadvertently been over-thinned.

FIGS. 1(a) to 1(d) show one method of making a plurality of devices from one array (or "tape") of nanowires. Individual devices may be defined by removing the matrix in between nanowires (which may also result in the removal of nanowires which happen to lie in the section to be removed), as is illustrated by the change from FIG. 1(a) to FIG. 1(b)—matrix is removed to produce two separated groups of nanowires and, in the example of FIG. 1(b), removal of the matrix also results in the removal of a nanowire.

Alternatively or in addition, the nanowires may be divided up along their length into several devices by removing suitable nanowire sections as illustrated by the change from FIG. 1(b) to FIG. 1(c), if this is required to isolate different devices from each other to provide, for example, electrical optical, thermal and/or mechanical decoupling). In other words, each of the smaller entities obtained in FIG. 1(d) constitutes one device (four devices in the example of FIG. 1(d), although the invention is not limited to this).

The reference 1e in FIG. 1(d) denotes points to five identical nanowires, of which three nanowires are contained in the smaller entity in the front and two nanowires in the entity at the back. The nanowires are identical in that they have (within the limits of the fabrication process) the same geometrical configuration and material composition.

The matrix 2 may be partially removed as shown in FIGS. 1(a) to 1(c), or it may be completely removed. The portions 2a of the matrix that are not removed may further be modified using an additive technique. For example, portions 2a of the matrix that are not removed may be provided with additional elements such as a metal layer on their upper surface which may be used as a etch mask while also helping to increase the conductivity of the matrix.

For simplicity, the following embodiments are illustrated using drawings resembling cross-sections of structures which are similar to the ones shown in FIG. 1(c). However, the invention is not limited to these. Again, these structures can be fabricated using a method disclosed in GB2442768, which teaches how to encapsulate elongate low dimensional structures with a rigid or semi-rigid material such that they form a continuous tape-like structure. The rigidity (e.g. a high elastic modulus material) might be desired to minimize the strain inserted onto the low-dimensional elongate structures during the bonding process. This is important as any residual strain may affect the final device performance.

Figure 2:
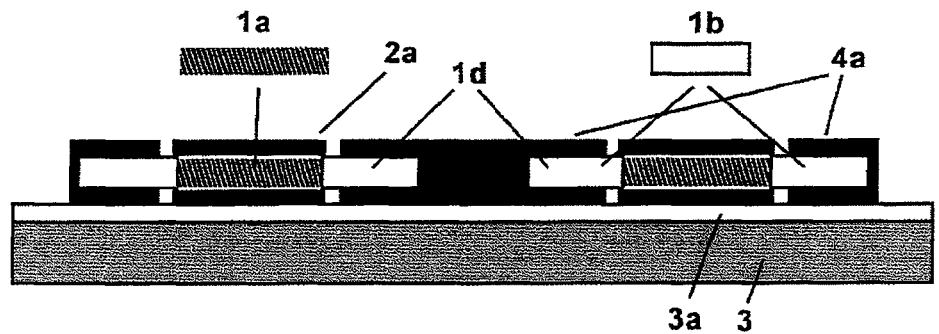
FIGS. 2(a) to 2(c) illustrate how a second layer of devices could be stacked onto a first layer of devices having the general structure shown in FIG. 1(c).
Figure 2:
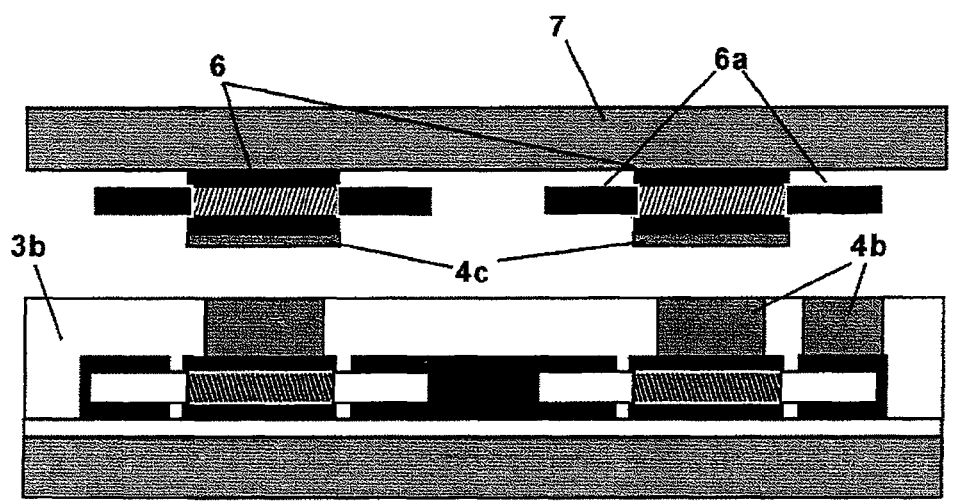
Figure 2:
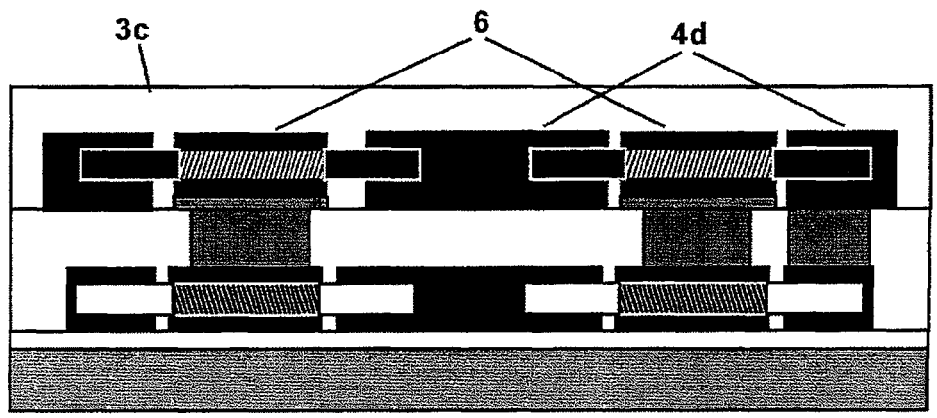

The portions 2a of the matrix may alternatively be fabricated by completely removing the initial material of 2 in FIG. 2(a), for example if it is unsuited for the envisaged device, and depositing new matrix material 2a using an additive technique.

FIGS. 2(a) to 2(c) show a method according to one embodiment of the present invention in which a plurality of devices 6 is fabricated onto a substrate 3 on which one layer of devices is already present. The cross section of these devices is shown in FIG. 2(a) and they may for example be fabricated using the approach illustrated in FIGS. 1(a) to 1(c). Furthermore, the devices may be partially or completely separated from the substrate 3 by a layer 3a, which may be used to insulate the devices from the substrate or may be required to promote adhesion of the devices to the substrate 3. It is important to note that the devices shown in FIG. 2(a) can each be replaced by any device circuit or device array which is compatible with the following processing techniques including, in particular, devices (e.g. transistors, light emitting devices, resistors, capacitors and sensors) and device circuits made of semiconducting material (e.g. Complementary Metal Oxide Semiconductor (CMOS) circuits) fabricated on silicon substrates or silicon on insulator substrates.

In this embodiment an insulating layer 3b is deposited over the devices already formed on the substrate, and vias are fabricated through the insulating layer 3b. The insulating layer 3b may be, or may contain an, adhesive, or may be capped with an additional layer (not shown) of a different material to aid the subsequent bonding process. Each via exposes a corresponding terminal of a device, and is subsequently filled with a conducting material 4b. This material 4b may be capped with an additional layer (not shown) of a different material to aid the subsequent bonding process. A second layer of devices 6 which are disposed on another substrate 7 is then bonded to the devices already formed on the substrate. This second layer of devices may contain a patterned layer 4c to promote the subsequent device bonding process. The patterned layer 4c is present on areas of the devices 6 in the second layer that will bond with the first layer of devices.

The electrical contact areas 6a of the devices 6 in the second layer may be exposed as shown in FIG. 2(b) before the transfer process. Alternatively, the contact areas 6a may be exposed after the devices 6 are released from the handling substrate 7.

Finally, as shown in FIG. 2(c), conductive contacts 4d are formed on devices of the second layer and the devices are encapsulated with an insulating layer 3c.

The materials 4b-4c used to bond the devices 6 to the first layer of devices may comprise metals (e.g. Cu, Al or Au) or conducting polymers, or any combination thereof.

The insulating materials 3b and 3c may consist of, for example, a patternable cross-linkable polymer (e.g. benzocyclobutene or an epoxy-based resin) or silicon dioxide or silicon nitride, or any combination thereof.

Additional deposition and patterning of conducting material may be done before depositing layer 3c.

The use of device structures having electrical contacts that are accessible from two opposing sides, such as the contact 6a of the devices of the second layer shown in FIG. 2(c), means that the devices may be electrically connected to both a device in a lower layer (that is, in a layer nearer the substrate) and to a layer further away from the substrate. This allows circuit structures that include any desired number of layers of devices to be fabricated (as described further with reference to FIGS. 3(a) and 3(b) below).

In the method the devices of the second layer (and of any subsequent layers) are transferred to the substrate using a handling substrate 7 which may then be removed. The present invention therefore eliminates the need to grind down the substrate of a subsequent circuit layer in order to reduce its thickness in the manner required in U.S. Pat. No. 7,193,239.

Moreover, the method of the present invention does not require that the devices of adjacent layers are arranged in rows, with the rows of one layer running perpendicular to rows of the adjacent layer. The present invention therefore provides a much greater freedom of design than the methods of U.S. Pat. No. 6,920,260 or U.S. Pat. No. 7,073,157.

Furthermore, in the method of FIGS. 2(a)-2(c), it is not necessary for all devices 6 of the second layer to be transferred from the handling substrate 7. If the patterned adhesive layer 4c is disposed over some devices of the second layer, but not over other devices of the second layer, only those devices on which a patterned adhesive layer 4c is provided will be bonded to the first layer of devices and hence transferred from the handling substrate 7. The present invention therefore allows the selective transfer of devices from the handling substrate and their subsequent integration into the circuit structure—which devices of the second layer are incorporated into the circuit structure is determined by the way in which the adhesive layer 4c and/or the adhesive counterpart (e.g. bonding metal interconnects) are patterned and provided. This allows transfer of selected devices from one set of devices from a handling substrate to different substrates.

In the method of FIGS. 2(a)-2(c) the devices 6 of the second layer are shown as bonded to conductive material 4b contained by the vias formed within the insulating layer. However, as noted above, an electrical contact (not shown) having a greater area than the associated via may be provided on the conductive material 4b of a via to increase the contact area—if this is present, the devices 6 of the second layer are bonded to the electrical contact and not direct to the conductive material 4b. Moreover, in such an embodiment, it is not necessary for all devices 6 of the second layer to be bonded to the electrical contacts if it is not desired to transfer all devices 6 of the second layer from the handling substrate 7, and it is possible to bond only selected ones of the second set of devices to the electrical contacts.

A further advantage of the present invention is that the use of devices having contacts that are accessible from two opposite faces means that the disadvantage of a low interlayer via density that occurs with face-to-back bonding is eliminated. Moreover, this is eliminated without the need for a costly SOI-based face-to-back bonding process.

A further advantage of the present invention is that one or more of (and preferably as many as possible of) the vias defined in the insulating layer 3b lie at least partially within the footprint of a device 6 of the second layer and the corresponding device belonging to the first layer. This reduces the area of the overall circuit structure that is taken up by vias, and so allows the overall area of the final circuit structure to be reduced or more complex circuitry to be realized on the same substrate area.

Providing one or more of the vias between the first and second device layers at least partially within the footprint of a device in both layers may be achieved by forming the vias in the insulating layer 3b so that they lie at least partially within the footprint of a device in the first layer, and then positioning the devices of the second layer so that their footprints at least partially encompass the vias. However, this may not be possible for all devices in the layers since, for example, the number of devices per layer may differ from layer to layer. Also, while FIGS. 2(a)-2(c) show the devices in the second layer as having the same size and arrangement as devices in the first layer, this need not always be the case. Thus, it may be the case that some vias lie at least partially within the footprints of only some devices of the first layer (which can be achieved by forming the vias at appropriate positions relative to the devices of the first layer) or that some of the vias lie at least partially only within the footprints of some devices of the second layer (which can be achieved by suitably positioning the devices of the second layer relative to the vias when the devices of the second layer are disposed on the insulating layer 3b).

In principle, as FIG. 2(b) indicates, a via could be wholly within the footprint of a device, especially a via placed opposite a centre of a device. Technically, this would require a larger degree of control over the alignment of vias with respect to the devices in the first layer and over the alignment of devices in the second layer with respect to the vias. It also requires additional control over the resolution, because the vias will have to be smaller than the devices. While both are desired, it may be technically easier and therefore cheaper to allow the vias to overlap only partially with the devices.

[As noted above, the term "footprint" as used herein is intended to encompass spaces between the nanowires of a device, in addition to the footprint of the nanowires themselves. Also as noted above, it is further preferable that the centre of a via is approximately coincident with the lateral centre of the devices].

A third layer of devices could be constructed and connected to the second layer in a similar way as the second device layer is realized as illustrated in FIGS. 2(a)-2(c). Where a third (or subsequent) layer of devices is provided, the structure and method of deposition of the third layer (or each subsequent layer) may correspond to any structure and any method of deposition described above for the second layer, and a detailed description of the structure and method of deposition of the third layer (or each subsequent layer) will therefore not be given. In particular, the devices of the third layer (or each subsequent layer) may be mirror symmetric.

Figure 3:
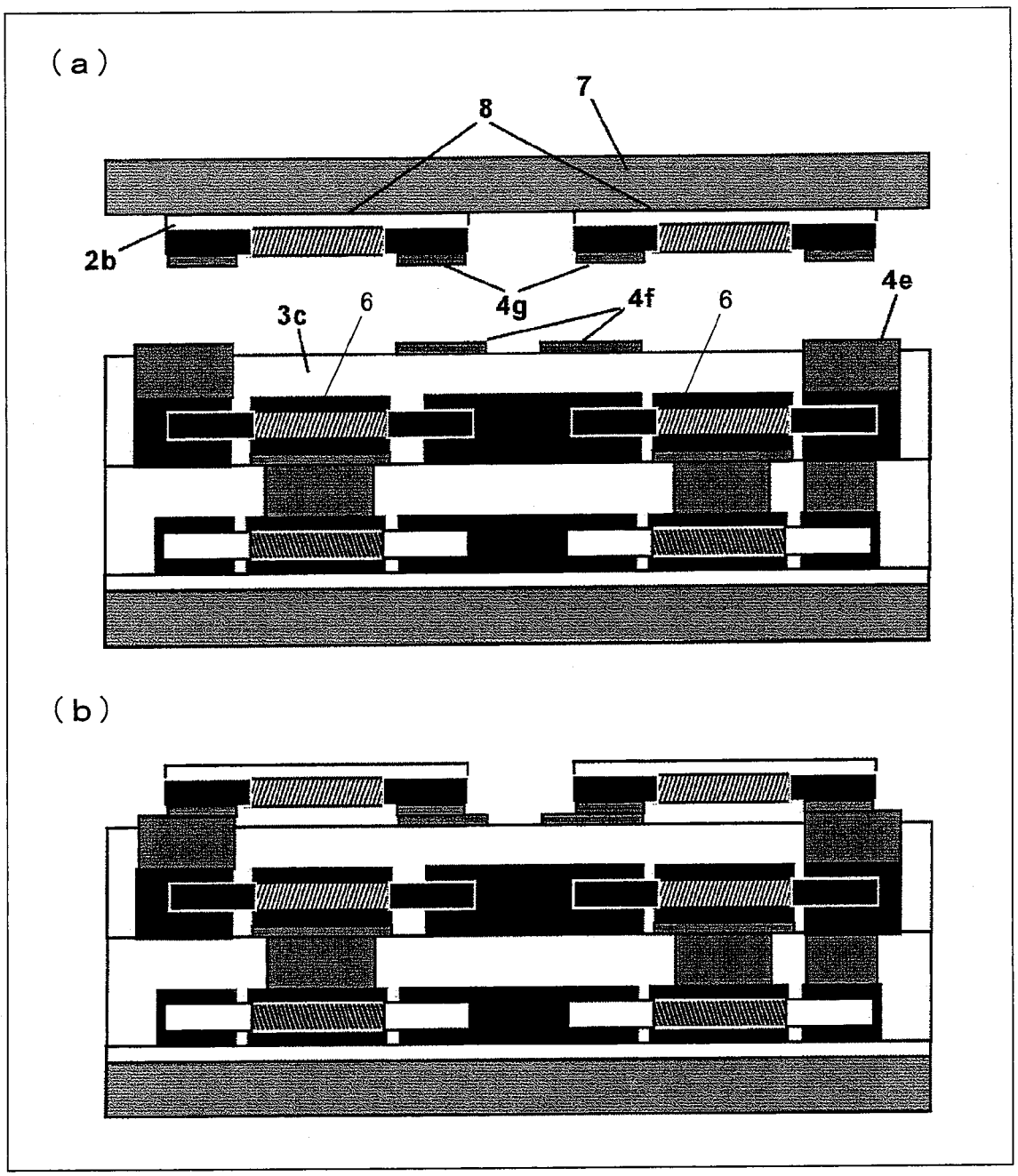
FIGS. 3(a) and 3(b) illustrate a variation of the method depicted in FIGS. 2(a) to 2(c) by adding a third layer of devices.

FIG. 3(a) and 3(b) illustrate the integration of such a third layer comprising in this embodiment two-terminal devices. Specifically, they illustrate the incorporation of a further layer of devices 8 onto the structure of FIG. 2(c). In FIG. 3(a), the third layer of devices is shown attached to a handling substrate 7.

In FIG. 3(a) vias are formed in an insulating layer 3c that overlies the second layer of devices 6, each via exposing a corresponding contact. Subsequently, a conductive material 4e is disposed in each via. Additionally, conductive patches 4f may be processed on the insulating layer 3c. Portions of the devices (for example, elongate low-dimensional structures) in the third layer which face the patches 4f are exposed, and are coated with a conductive material 4g. The side of the devices 8 facing away from the patches 4f is still attached to parts of the matrix 2b and thence to the handling substrate 7.

The conductive material 4e, 4f and 4g may also aid the subsequent bonding process.

FIG. 3(b) shows the devices 8 of the third layer being bonded to the second layer of devices 6 and the handling substrate 7 removed. If however the devices 8 are part of the last device layer of the structure, it may be beneficial not to remove the handling substrate 7. This is particularly the case if the final device layer consists of a silicon device circuit (e.g. CMOS) and the handling wafer coincides with the silicon substrate on which the silicon devices are fabricated.

If the handling substrate is removed the layer 2b may be completely or partially removed after the bonding process. Finally an additional patterned metal layer (not shown) might be processed.

The transferred devices 8 of the third layer may be encapsulated in another insulating layer (not shown).

As with the embodiment of FIGS. 2(a) to 2(c), it is possible to transfer only selected devices 8 from the handling substrate and integrate them into the final circuit structure. This may be done by providing adhesive material on some of the devices of the third layer but not on others (or by providing adhesive material on regions of the upper surface of insulating layer 3c that corresponds to some devices on the third layer but not on regions of the conductive layer 3c corresponding to other devices of the third layer).

One or more, and preferably as many as possible of, the vias that pass through the insulating layer 3c are again preferably arranged so as to lie at least partially within the footprint of a corresponding device 8 of the third layer and a device of the second layer, in order to allow the overall area of the final circuit structure to be minimized.

The present invention is not limited to the production of a circuit structure having two or three layers of devices as shown in FIGS. 2(c) and 3(b) respectively. By repeating the steps of disclosing an insulating layer over the uppermost layer of devices, forming vias to expose contacts of these devices, and depositing a further layer of devices in a manner similar to that shown in FIG. 2(b) or 3(a), it is possible to produce a circuit structure having any desired number of layers of devices.

Figure 4:
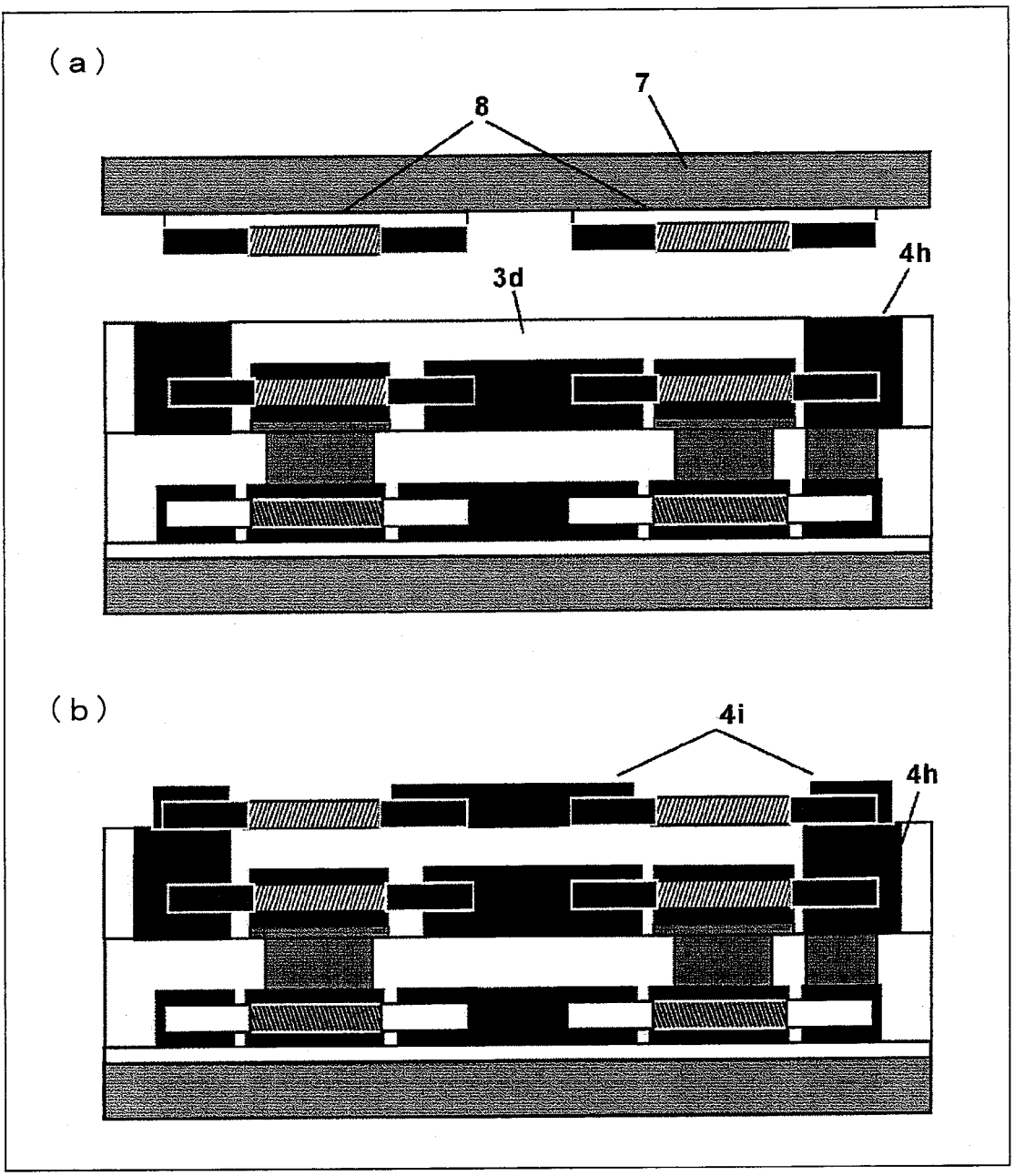
FIGS. 4(a) and 4(b) illustrate assembling a third layer of devices using an adhesive insulating layer.

FIG. 4(a) and 4(b) illustrate another embodiment of this invention. This again is described with respect to the incorporation of a third layer of devices 8 into the structure of FIG. 3(b). In this embodiment, the surface of the patterned insulating layer 3d disposed over the second layer of devices also acts as an adhesive during the bonding process. The vias processed into the insulating layer 3d may be filled with a conductive material 4h. The surface of the devices 8 of the third layer may be partially or completely coated with a film (not shown) which aids the subsequent bonding process.

The layer 3d may be, for example, a highly cross-linkable polymer (e.g. benzocyclobutene or an epoxy-based resin).

After the bonding process, the vias may be filled with a conducting material 4h if not already done so, and finally a patterned layer 4i of a conductive material is fabricated.

In all previously mentioned bonding processes the following parameters will affect the quality (e.g. bonding strength) of the bonding: temperature, pressure, time, elastic modulus, surface chemistry and surface topography.

The contacts and metallized vias 2a, 4a, 4b, 4c, 4d, 4e, 4f, 4g, 4h and 4i along the largest dimension of the elongate low dimensional structures may be formed using any of the following techniques:

1. Additive (e.g. self assembly, deposition, transfer)
    Deposition methods include but are not restricted to direct or indirect thermal evaporation, sputter deposition, chemical vapour deposition, molecular beam epitaxy, atomic layer deposition, spin coating, and ink-jet printing
    Transfer methods include dry transfer methods such as stamp-based transfers, and device bonding as well as wet transfer methods where the transfer of the desired structures occurs out of solution.
2. Subtractive (e.g. etching, sputtering, dissolving)
    Etching includes wet-chemical etching and dry etching (e.g. reactive ion etching). Dry etching techniques may be combined with sputtering techniques.

Abrasive techniques such as polishing
Any combination of the above such as chemical mechanical polishing (CMP)
3. Selective (e.g. chemical functionalization, local heating, local exposure to particles, local exposure to mechanical stress, use of shadow masks)
Local heating may occur due to a localized exposure to an energy source (e.g. a focused laser beam, selective exposure using a mask) or due to the energy absorbing properties of the elongate low dimensional structures or sections within the elongate low dimensional structures.
Chemical functionalization may utilize particular surface properties of the elongate low dimensional structures being defined by the material composition
Local exposure of particles includes lithographic methods such as photo-lithography and electron beam lithography but also focused ion beam and local exposure to x-rays. Local exposure to mechanical stress includes imprint technologies The insulating layers $3b$, $3c$ and $3d$ may be processed using any of the additive, subtractive or selective techniques described above. This includes any combination of the aforementioned techniques.

Figure 5:
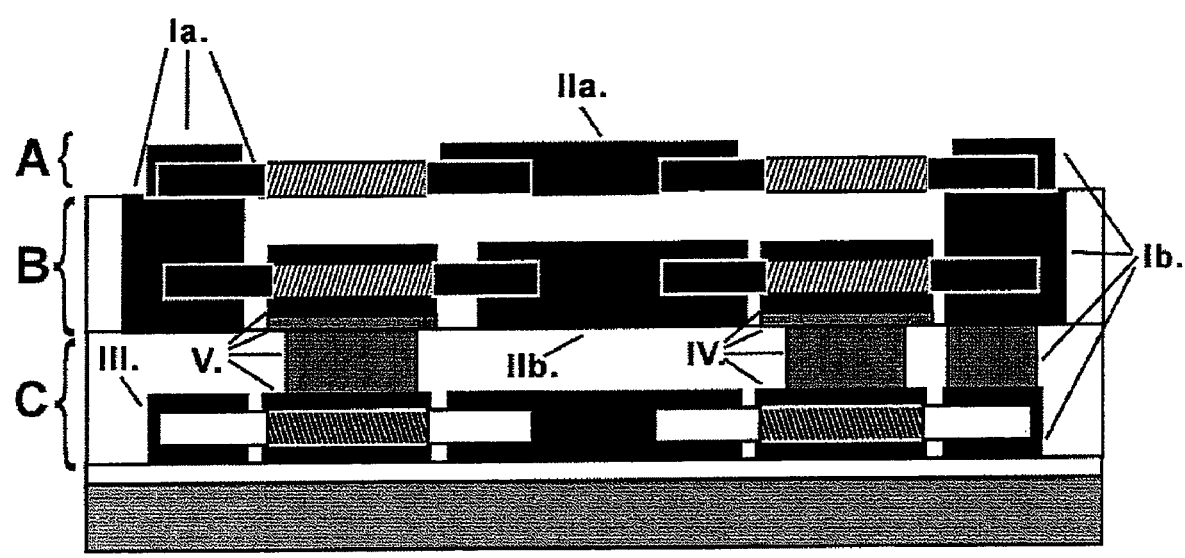
FIG. 5 is identical with FIG. 4(b) but illustrates electrical connections between the devices.
Figure 6:
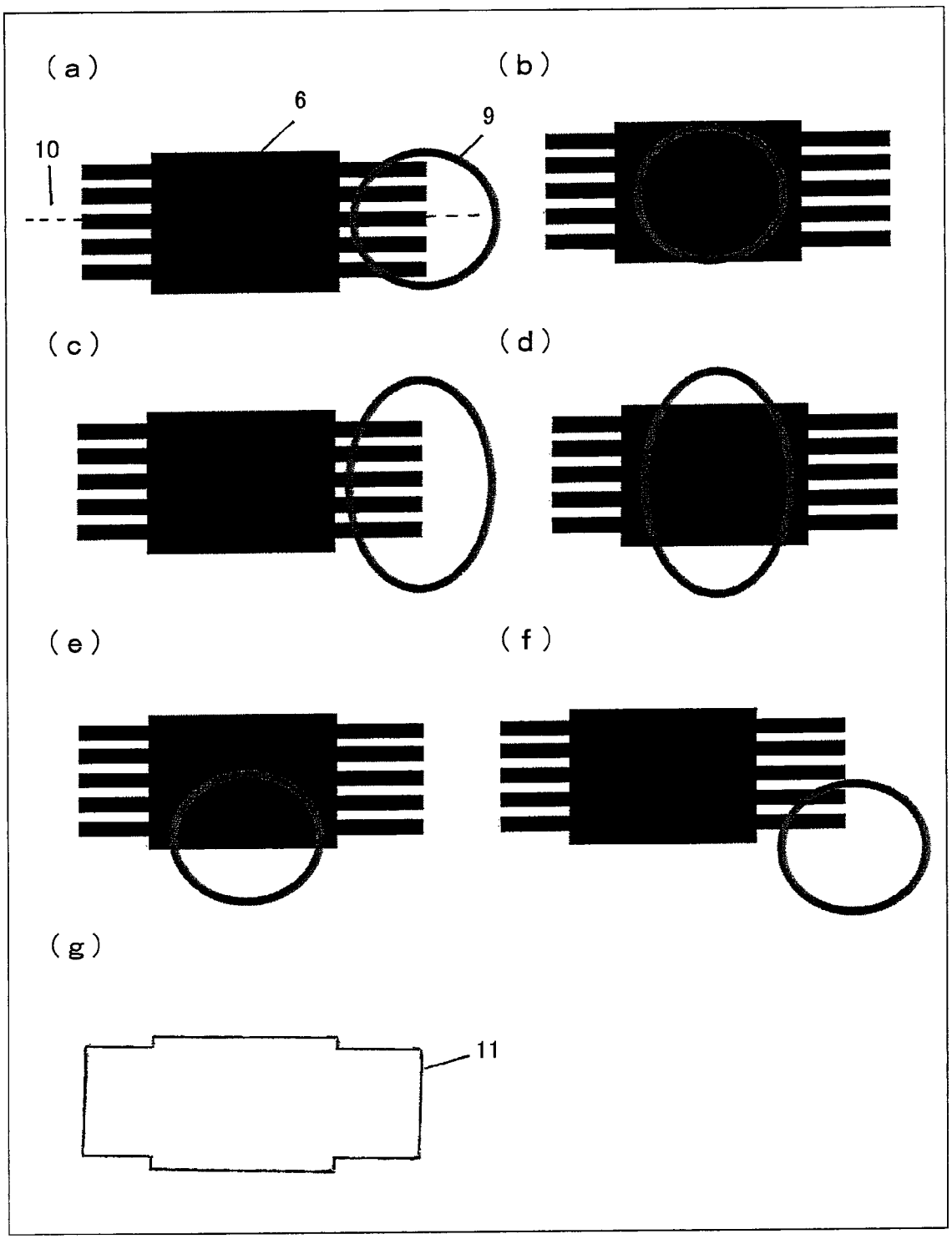
FIGS. 6(a) to 6(f) are schematic plan illustrations showing preferred and non-preferred positions of the vias.
FIG. 6(g) is a schematic plan illustration showing the "footprint" of a device.

FIG. 5 is a sectional view through a circuit structure obtained by a method of the invention. In FIG. 5 layer C (the first layer of devices to be provided on the substrate) contains npn transistors, layer B (the second layer of devices) contains pnp transistors and layer A (the third layer of devices) contains light emitting devices (LEDs). If terminal III is set to potential V−, terminals IIa and IIb to potential V+, terminal IV to input 1 and V to input 2, and if terminals Ia and Ib are electrically connected, then the output at terminals Ia and Ib is NOT (Input 1 AND Input 2) and a voltage drop across the LEDs in layer A is applied if this output is V−.

The examples described above relate to the manufacture of circuit structures having two or three layers of devices. However, the invention is not limited to this, and may be applied to the manufacture of a circuit structure having more than three layers of devices.

In a circuit structure of the present invention, the devices of the upper layer may have contacts that are accessible from at least two different sides. This may assist in the formation of contacts to the finished device. Moreover, the devices of the upper layer of devices in the circuit structure may be symmetric.

The lower layer of devices may be fabricated in-situ on the substrate 3. Alternatively, they may be fabricated on a formation substrate, and transferred to the substrate 3 using known techniques.

The devices of the lowest layer of devices (that is, the devices nearest to the substrate 3) may contain contacts that are accessible from both sides and the devices may be symmetric.

In circuit structures that contain three or more layers of devices, it is preferable that vias between any two layers of devices lie wholly or partially within the footprint of both of the devices which are connected by the interconnect running through the corresponding via, in order to maximize the area of the substrate that may be occupied by devices.

In the embodiments described above the electrical contacts between layers are shown as connecting the bottom side of at least one device of the second device layer with the top side of at least one device of the first device layer. The contacts between adjacent layers may however alternatively connect the top side of at least one device of the second device layer with the top side of at least one device of the first device layer.

It is also important to note that it is generally desired to reduce the contact resistance of electrical device contacts. This is why it is in many cases desired to form the contacts independent of the metal interconnects filling the vias. E.g. the layer $4c$ in FIGS. 2($b$) and 2($c$) may not only be required to facilitate the bonding process, but it may also determine the area of the electrical contact formed to the left device 6 belonging to the second device layer. A similar conducting layer may be required to maximize the contact area to the device belonging to the first device layer (this layer is not shown). On the other hand, the via on the very right which allows to connect the right end of the right device 6 belonging to the second device layer with the right end of the right device belonging to the first device layer has little, if any, impact on the corresponding contact areas because the contact areas are predominantly determined by the metallization layers $4a$ and $4d$. Arranging the vias between the devices belonging to different device layers allows to form interconnects without the need to form extensive metal lines to these vias. The area occupied by these metal lines (e.g. $4a$ and $4d$), which generally lie within device layers is therefore minimized allowing higher device densities.

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A circuit comprising:
a) a first layer of devices disposed over a substrate;
b) an insulating layer covering the first layer of devices, the insulating layer containing one or more vias, the one or more vias each exposing a respective contact of a device of the first layer;
c) a second layer of devices each having a respective contact, the devices of the second layer being positioned such that a contact of the device is aligned above a respective via in the insulating layer; and
d) electrical contacts formed through each of the one or more vias between at least one device of the first layer of devices and at least one device of the second layer of devices to connect the respective contacts of the first and second layers, wherein at least one via containing an electrical contact is at least partially within the footprint of a device belonging to the first layer and at least partially within the footprint of a device belonging to the second layer; and
wherein at least one respective contact of a device of the second layer comprises an electrical contact area that receives a conductive contact on two opposing sides and is disposed over the insulating layer such that the electrical contact area of the device is facing, yet spaced apart from, and is aligned above a respective via in the insulating layer.

2. A circuit as claimed in claim 1 wherein at least one device of the second layer comprises a first electrical contact that can be accessed from a first side of the device and a second electrical contact that can be accessed from a second side of the device, the first side being opposed to the second side.

3. A circuit as claimed in claim 1 wherein an electrical contact connects the bottom side of at least one device of the second device layer with the top side of at least one device of the first device layer.

4. A circuit as claimed in claim 1 wherein an electrical contact connects the top side of at least one device of the second device layer with the top side of at least one device of the first device layer.

5. A circuit as claimed in any of claim 1 wherein the devices of the first layer comprise elongate low-dimensional structures.

6. A circuit as claimed in claim 1 wherein the devices of the second layer comprise elongate low-dimensional structures.

7. A circuit as claimed in claim 1 wherein the devices of the second layer are mirror symmetric about a symmetry plane extending parallel to the substrate.

8. A circuit as claimed in claim 1 wherein a centre of at least one via in the insulating layer is approximately coincident with a centreline of an associated device of the first layer and/or with a centreline of an associated device of the second layer.

9. A circuit as claimed in claim 1 wherein a centreline of a device of the first layer is substantially coincident with a centreline of an associated device of the second layer, and wherein a centre of an associated via in the insulating layer is substantially coincident with a centreline of the device of the first layer and with a centreline of the associated device of the second layer.

* * * * *